United States Patent [19]

Quinn

[11] 4,058,219
[45] Nov. 15, 1977

[54] METHOD AND APPARATUS FOR AUTOMATICALLY TESTING REELED AXIAL-LEAD ELECTRICAL DEVICES UNDER ENVIRONMENTAL CONDITIONS

[75] Inventor: Peter W. Quinn, Danbury, Conn.

[73] Assignee: Lorlin Industries Inc., Danbury, Conn.

[21] Appl. No.: 735,419

[22] Filed: Oct. 26, 1976

[51] Int. Cl.² .............................................. B07C 5/08
[52] U.S. Cl. .................................................. 209/81 R
[58] Field of Search ................ 209/81 R; 324/158 D, 324/158 T, 73 AT, 73 R, 72

[56] References Cited
U.S. PATENT DOCUMENTS

| 3,092,253 | 6/1963 | Senger | 209/81 R |
| 3,179,248 | 4/1965 | Manley | 209/81 |
| 3,412,333 | 11/1968 | Frick et al. | 324/73 AT |
| 3,560,849 | 2/1971 | Ryan et al. | 324/73 R |
| 3,629,702 | 12/1971 | Henken | 209/81 R |

Primary Examiner—Allen N. Knowles
Attorney, Agent, or Firm—Anthony J. Casella

[57] ABSTRACT

Reeled axial-lead devices such as diodes, resistors, capacitors, inductors, transistors and SCRs are carried in linear array by two coextensive tapes wound about a reel. The reel-to-reel apparatus of the invention includes a take-up reel and drive means for conveying the taped electrical components from the supply reel to the take up reel, and disposed intermediate said conveyor is an environmental chamber through which the taped reel is threaded. While in the environmental chamber, the electrical components and the tapes are selectively subjected to differential temperatures whereby only the electrical components are heated or cooled to the desired temperature preparatory to testing. Subsequentially, each electrical component is sequentially tested, and if found defective, is removed from the tape carrier by cutter means. The reeled components are then wound about the take-up reel.

20 Claims, 7 Drawing Figures

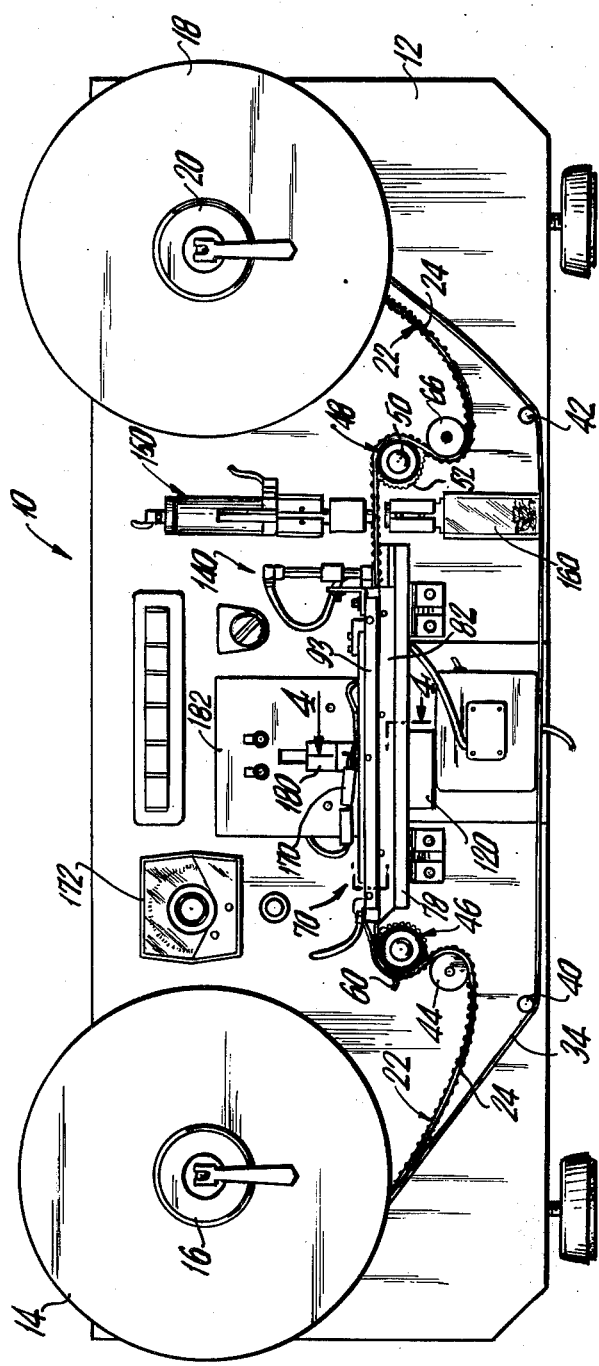

METHOD AND APPARATUS FOR AUTOMATICALLY TESTING REELED AXIAL-LEAD ELECTRICAL DEVICES UNDER ENVIRONMENTAL CONDITIONS

BACKGROUND OF THE INVENTION

The subject invention relates to a reel-to-reel handler employed in automatic test systems, and is designed to automatically test under environmental conditions reeled axial-lead devices such as diodes, resistors, capacitors, inductors, small-signal transistors, and SCRs.

Reeled axial-lead devices generally include a linear array of electrical components having opposed axial leads that are connected or encapsulated in elongated carriers, generally made of two parallel strips of tape material. The tape carriers maintain the axial-lead devices in spaced parallel relationship along the length of the tapes, and the resulting taped components are wound about a reel, with the layers of the components being separated by a strip of paper. Heretofore conventional reel-to-reel automatic electrical test handlers operated to sequentially test the axial-lead devices under ambient temperature conditions, or, it has been known to completely place the entire reel-to-reel handler within a large chamber, and heat the chamber to the desired environmental temperature conditions preparatory to the electrical testing of the electrical components. As is readily apparent, because of the fact that the component leads are merely connected to the tape carriers by the adhesive on the tape, when subjected to elevated temperatures, the adhesive on the tape softens, thereby causing the axial-lead devices to move, become misaligned, and possibly become disengaged from the tape carriers. In addition to the problem associated with the disengagement of the electrical components from the tape, since the entire reel-to-reel handler is disposed within the environmental chamber, it is difficult for operators to use the apparatus because of the heat generated within the chamber, and accordingly it takes a relatively long period of time for the operator to install and remove reels of components to be tested. In addition, with each removal and installation of a reel, the operator must wait a sufficient period of time in order to enable the apparatus to be brought up to desired environmental test conditions. The desirability for testing the reeled axial-lead devices under environmental conditions is particularly important in more sophisticated electronic systems, and in those applications wherein the components are to be embodied in apparatus which operates under either higher temperature conditions or lower temperature conditions than ambient. Examples of those conditions are electrical apparatus which are employed in a box radio, an automobile, or any sealed case wherein the temperature goes above or below normal room temperature.

Another shortcoming of prior art reel-to-reel handlers results from the arrangements provided in such prior art handlers for conveying the devices to the testing station. In one apparatus, the mechanism for moving the taped component is performed by a motor which moves a cam that, in turn, moves an entire track which shuttles or carries the components along in a sequential manner. The track is configured to include a plurality of upstanding walls, whereby the adjacent axial-leads are disposed within the spaces defined intermediate the upstanding walls. The track is moved in a circular movement, to effectively lift the entire reel, and at the same time, project the reel forwardly to the equivalent of one spacing of the electrical components, and at the completion of its circular movement, the track then engages the next, or downstream, set of electrical components. During the upward movement of the track, a fowardmost electrical component is forced into contact with the test contacts of the electrical tester, and at that time said forwardmost component is tested. In order to achieve precise feeding of the axial-lead components, it is apparent that the track mechanical structure must be precision made, thereby resulting in the relatively high cost of the prior art reel-to-reel handler. In addition, because of the weight and inertia of the movable track, that is continuously operated through a circular path, the speed of operation of the prior art handler must be limited in order to limit the amount of vibration generated by the constantly moving mass of the track, thus limiting the speed of operation of the prior art handler. Another shortcoming of the prior art device is that no means are provided for ensuring that a space left in the reel of components, such as by the removal of an electrical components, prior to the testing station, will not be moved by the track into position beneath the test points. In other words, if an electrical component is removed from the reel prior to testing, that portion of the tape would still be forced by the movable track beneath the testing station, and the test would, of course, result in a reading that a defective part exists at that point. Usually, reel-to-reel handlers are designed such that after a certain number of defective parts are detected, the machine is automatically stopped. Thus, it is possible that the prior art device may be inadvertently shut down, not because the reel contains a certain number of defective parts, but because a certain number of electrical devices had been removed from the reel prior to being positioned on the reel-to-reel handler. The inadvertent stoppage of prior art handlers thereby results in lost testing time, as well as the necessity for the operator to continually monitor the operation of the apparatus.

BRIEF SUMMARY OF THE INVENTION

It is the primary object of the subject invention to overcome the shortcomings of prior art reel-to-reel handlers, and to add speed and efficiency to automatic test systems, while at the same time providing environmental test conditions for the electrical components.

It is another object of the subject invention to provide a new and improved reel-to-reel handler apparatus including improved drive means for conveying taped electrical components, including means for automatically stopping the conveying of the tape when an electrical component is in position for testing.

It is still a further object of the subject invention to provide an improved reel-to-reel handler apparatus including means for subjecting the electrical components to the desired environmental temperature conditions, while maintaining the temperature of the tape carrier at ambient conditions, thereby obviating misalignment or loosening of the components from the tape carrier.

It is a further object of this subject invention to provide a reel-to-reel handler apparatus having a transport-tape drive system including sprocket-drive rollers that move the transport tape at high speed, and which are capable of conveying tapes carrying different types of axial-lead devices.

It is still a further object of the subject invention to provide a new and improved method for automatically testing electrical components including the step of subjecting the electrical components to a differential temperature relative to the temperature of the associated tape carrier.

These and other objects and advantages are realized by the present invention, which provides a unique reel-to-reel handler which adds speed and efficiency to automatic test systems, along with a unique method for automatically testing taped electrical components. In the subject apparatus, drive means are provided for conveying the reeled electrical components from the supply reel to the take-up reel, and for moving said taped reel through an environmental chamber wherein the temperature of the electrical components is selectively varied relative to the temperature of the tape carrier. Downstream of said environmental chamber, testing means are provided for sequentially testing the electrical components, and if found defective, cutter means are provided for physically removing the electrical component from the tape carrier. Preferably, the transport-tape drive system includes a pair of grooved capstans or sprocket drive rollers, the downstream roller being connected to a stepper motor, while the upstream roller is connected to a eddy-current brake for maintaining tension on the tape, as it passes through the environmental chamber. Each sprocket-drive roller is preferably made of a plastic material and includes rubber end portions for engaging the tape portions of the reel of components. The environmental chamber is preferably made of an upper movable hood and a lower fixed member, said hood and lower member including aligned central channels to accommodate the electrical components, and said members being spaced to enable the leads of said components and the tape carriers to readily move therebetween. The central chamber is connected by suitable conduit means to either a source of hot air flow, or a source of cold air flow. The environmental chamber also includes two additional plenums which are disposed above the opposite tape carriers of the reel of components. These plenum chambers are in communication with the spaces adjacent the tape carriers by suitable apertures, and when hot air flow is provided to the central chamber to heat the electrical components, cool air is provided to the tape carriers in order to maintain the temperature of the tape at ambient conditions, thereby preventing loosening of the leads of the components from the tape carriers. The subject apparatus also includes optical sensing means for controlling the transport-tape drive system when an electrial component is in position to be tested. Accordingly, if a device has been removed from the reel of components prior to testing, the transport-tape drive system will continue to convey the reel of components until such time as a component is positioned below the testing station. At such time, the transport-tape drive system stops, and the testing means is actuated to test the component.

In the subject method, the reel of components is conveyed in linear array from the supply reel to the environmental chamber, wherein said electrical components and the tape carrier are subjected to differential temperature conditions, the tape is then conveyed to the testing station wherein the components are sequentially electrically tested, after which the reel of components is wound about the take-up reel.

Additional details of the invention will be disclosed in the following description, taken in conjunction with the accompanying drawings.

BRIEF DESCRIPTION OF THE DRAWINGS

FIG. 1 is a frontal view of the apparatus made according to the teachings of the subject invention;

FIG. 2 is a perspective view of a reel of components including a paper carrier;

FIG. 3 is a partial sectional view illustrating a portion of the transport-drive system of the subject apparatus;

DESCRIPTON OF PREFERRED EMBODIMENT

Figure 4:
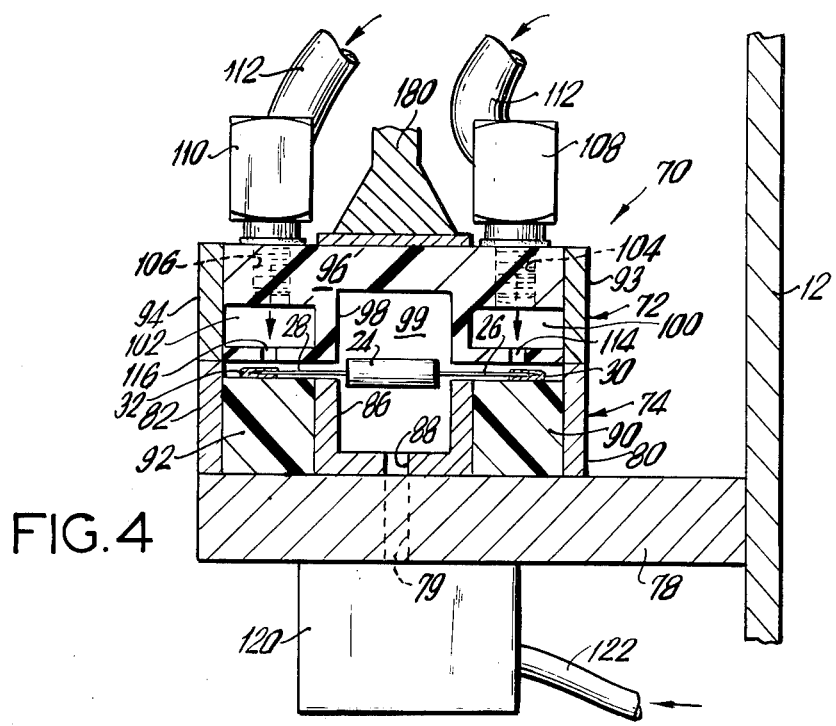
FIG. 4 is a sectional view taken along line 4—4 in FIG. 1.

Referring to FIG. 1, the reel-to-reel handler of the subject invention is generally designated by the numeral 10, and includes a box-like structure having a front plate 12. Disposed within the box are the electrical motors and electrical control circuitry for operating and testing electrical components, as more particularly set forth below. Rotatably mounted on the front plate 12 is the supply reel 14 that is disposed about a spindle and securely held by an expansion-type locking mechanism 16. The reel of components is generally designated by numeral 22, and is illustrated in FIG. 2. Each reel of components includes a plurality of axial-lead devices 24 such as diodes, resistors, capacitors, inductors, small-signal transistors, SCRs, and the like, each including axial-leads 26 and 28, the ends of which are encapsulated within carrier tapes, designated by the numerals 30 and 32. The latter are conventional tapes made of paper and glue. A strip of paper 34 separates the concentric rows of axial-lead devices 24 when reeled about the supply and take-up reels.

As shown in FIG. 1, the strip of paper 34 is threaded about idler rolls 40 and 42 and threaded onto the take-up reel 18. The take-up reel is mounted on a driven spindle that is driven by a synchronous motor through a variable-type slip clutch (not shown), thus providing a constant pressure on the reel of components 22, regardless of the number of components remaining on the take-up reel 18. The latter is securely held on a spindle by expansion-type locking mechanism 20. The spindle on which the supply reel 14 is mounted is braked or controlled by an eddy-current motor to maintain the proper tension on the supply reel 14 as it rotates. Power to this motor is supplied from a power supply disposed within the apparatus 10.

As shown in FIG. 1, the reel of components 22 is passed about a smooth roller 44, preferably made of a plastic material, and then wound about a first sprocket-drive roller 46 which forms a portion of the transport-tape drive system of the subject invention. The reel of components 22 is then threaded through the environmental chamber 70, and downstream of the environmental chamber 70 the components are tested by the testing mechanism, designated by the numeral 140. Those components which are found to be defective are subsequentally cut from the reel of components by the reject cutting mechanism 150, and the rejected components are collected in bin 160. Alternatively, means may be provided by mark the tape carrier at the location of a defective component. The components are threaded about a second sprocket drive roller 48, and then passed about a second smooth plastic roller 66 preparatory to being wound about the take-up reel 18. The second sprocket drive roller 48 is illustrated in FIG. 3 and includes a spindle 50 to which is attached the plastic sprocket 52 having recesses 54 that are spaced to correspond to the spacing of the axiallead devices 24 on the reel of components 22. Disposed on opposite sides of the plastic sprocket 52 are semi-soft annular rubber gaskets 56 and 58 which are adapted to engage the encapsulating tape carriers 30 and 32. The rubber gaskets function to add tension to the tape carrier so that it does not slip easily over the sprocket drive rollers 46 and 48. The second sprocket drive roller 48 is driven by a stepper motor, while the first sprocket drive roller 46 is connected to an eddy-current brake, which is a variable tension brake that is operative from zero torque to thirty inch-ounces of torque. The first and second sprocket drive rollers which form a portion of the transport-tape drive system ensure that the proper tension is maintained on the reel of components 22 as it is being passed through the environmental chamber, as well as to ensure the accurate positioning of the respective axial-lead devices below the contacts of the testing mechanism, as more fully described hereinafter.

As illustrated in FIG. 1, cantilevered spring members 60, secured to the environmental chamber 70 may be provided for maintaining the encapsulated tape carriers 30 and 32 against the semi-soft annular rubber gaskets of the first sprocket drive roller 46.

Figure 5:
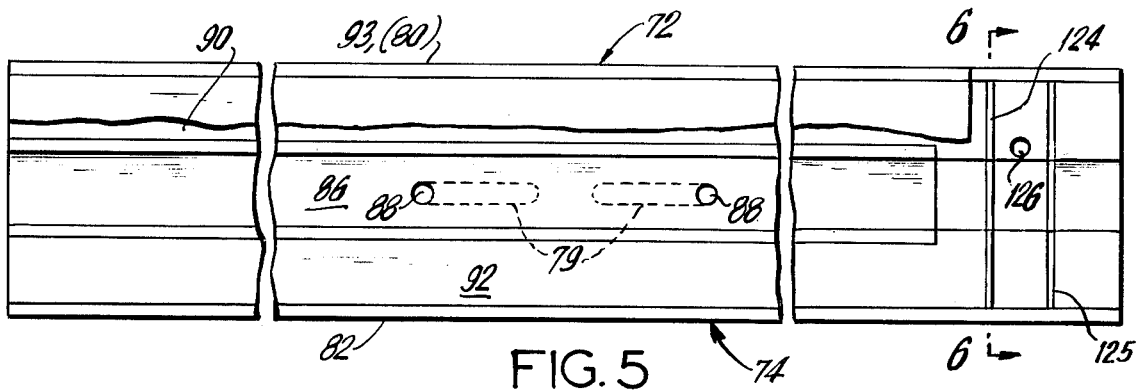
FIG. 5 is a plan view of the lower fixed member of the environmental chamber of the subject invention.

Referring to FIGS. 4 and 5, the environmental chamber 70 basically comprises a vertically movable heating hood 72 which cooperates with a lower, fixed support track 74 for defining the path through which the reel of components 22 is transported. The environmental chamber 70 is supported by a cantilevered aluminum support plate 78 extending from the front plate 12. The lower, fixed support track 74 includes end plates 80, 82 which are preferably made of stainless steel, a central U-shaped aluminum heat conducting channel 86, having apertures 88 therein, and intermediate plastic blocks 90 and 92. The apertures 88 are in communication with inclined apertures 79 disposed in the support plate 78, as more particularly illustrated in FIG. 5. Depending from the cantilevered support plate 78, and in communication with the apertures 79 is a chamber 120 that is connected by suitable tubing 22 to a source of air, either heated or cooled, as required for the particular environmental testing. As illustrated in FIG. 4, the height of each end wall 80 and 82 is greater than the height of the respective plastic block 90 and 92.

The vertically movable heating hood 72 basically includes end walls 93 and 94, preferably made of stainless steel and a central block 96 of plastic material. As shown in FIG. 4, plastic block 96 includes a central channel 98 which is aligned with the heat conducting channel 86 of the support track 74 to define a central chamber 99 of the environmental chamber 70. In addition, the plastic block 96 includes enclosed chambers, designated 100 and 102, disposed at the opposed ends of the block 96. The chambers 100 and 102 define plenum chambers that are in communication via apertures 104 and 106 to fittings 108, 110 to which tubing 112 is connected. In turn, the tubing 112 is connected to a source of cool air. The plenum chambers 100, 102 further include apertures 114 and 116 which are in communication with the spacing between the upper heating hood 72 and the lower fixed support track 74, with said apertures 114, 116 being respectively disposed above the tape carriers 30 and 32 of the reel of components. As illustrated in FIG. 4, because of the differential height of the ends plates 80, 82 and the plastic blocks 90, 92, when the movable hood 72 is engaged with the support track 74, a space is defined between the movable hood 72 and the support track for passage of the reel of components. The devices 24 are disposed within the central chamber 99, whereas the leads 26 and 28 extend between the spacing intermediate hood 72 and support 74. The tape carriers 30 and 32 are disposed in the vicinity of the apertures 114, 116.

Rigidly secured to the movable heater hood 72 is a lifting mechanism 180 which is operatively connected to actuator 182 (see FIG. 1) for vertically displacing the movable hood 72. The latter is actuated to its uppermost vertical position for enabling a reel of components to be threaded through the environmental chamber 70, and thence lowered to its operative position as shown in FIGS. 1 and 4.

When it is desired to operate the subject apparatus to test the electrical components under elevated temperature conditions, hot air is ducted via tubes 122 to the chamber 120, and then through apertures 79 to the central chamber 99. At the same time, in order to maintain the tape carriers 30 and 32 at ambient conditions, cool air is ducted through the tubing 112 to the plenum chambers 100 and 102, and thence through apertures 114 and 116 to the vicinity of the tape carriers. Preferably, the inclined apertures 79 are inclined at 45° opposed angles such that the forced hot air flow enters the central chamber generally horizontally. The temperature of the air within the central chamber 99 is monitored by a suitable thermocouple, designated by numeral 170 in FIG. 1. Thermocouple 170 is connected to the temperature controller 172 mounted on the front plate 12 of the apparatus. The temperature controller 172 regulates the temperature within the central chamber 99, preferably within plus or minus 5° C. The forced hot air entering the central chamber is preferably at a pressure of 10 to 15 PSI in order to continually wet the surface of the electrical components 24 that are conveyed through the environmental chamber. The advantage achieved by the forced convection of pressurized hot air as contrasted to conduction is the more rapid heating of the components 24 to the desired temperature preparatory to electrical testing. It has been found that small-signal transistors, such as TO- 92 transistors, or similarly small axial lead diodes can be heated within eighteen seconds of the time the component enters the environmental chamber 70. With this rate of heating, it is possible to operate the conveying portion of the subject apparatus at a rate such that approximately four components per second may be tested, and still be heated to the desired elevated testing temperature of 85° C. In addition to forcing pressurized hot air to the environmental chamber, cool air flow, such as carbon dioxide, nitrogen, or cold air may be provided to the central chamber 99 in order to test compounds 24 at low temperature environmental conditions.

Figure 6:
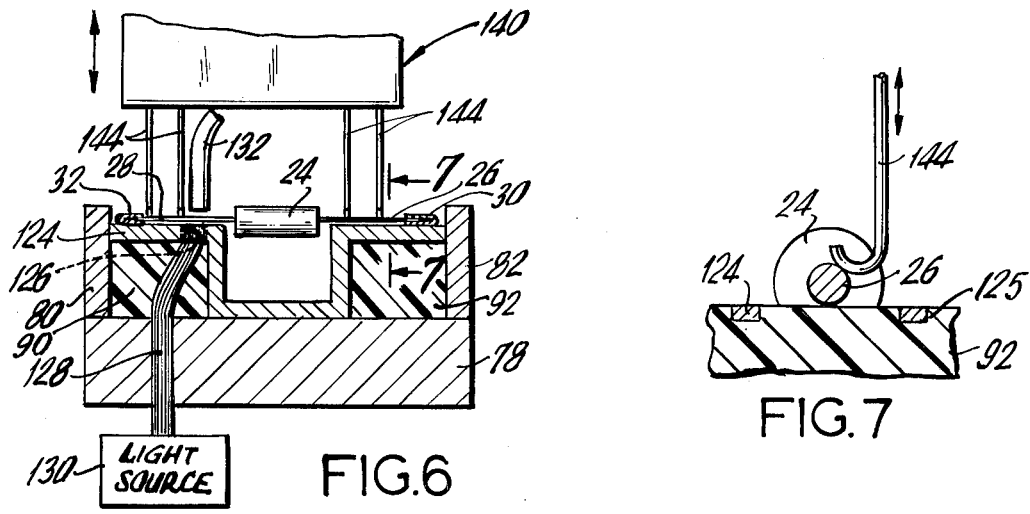
FIG. 6 is a sectional view taken along line 6—6 in FIG. 5.
Figure 7:
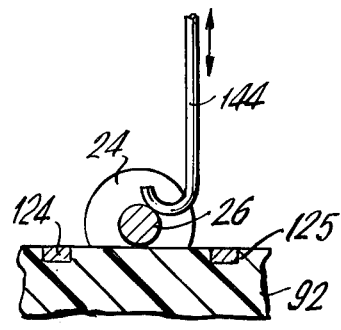
FIG. 7 is a view taken along line 7—7 in FIG. 6.

As each component leaves the environmental chamber, corresponding to the downstream end of the upper movable heating hood 72, it passes over a strip of metallic material embedded in the plastic surface of the lower support track 74, which metallic strip is designated by numeral 124 in FIG. 5. A second metallic strip 125 is also embedded in the plastic strip. Each strip of metallic material 124, 125 runs across the width of the support track 74, and is preferably made of thin sheet copper, on the order forty thousandths of an inch thick. Electrical testing of the reel of components occurs while each component is disposed between the metallic strips 124 and 125. Each strip is grounded and the purpose of having the metallic strips 124 and 125 in the vicinity of the electrical testing is to minimize surface contamination, such as oils and other dirt, on the leads of the components, which contamination would affect the actual test results of the electrical element. As shown in FIGS. 5 and 6, the plastic intermediate strips 124 and 125 includes an aperture 126 which is connected by a fiber optic bundle 128 to a light source, designated by the numeral 130. Disposed immediately above the aperture 126 is a light sensor, schematically illustrated in FIG. 6 and designated by the numeral 132. In the vicinity of aperture 126 in the support plate 74 is the electrical testing mechanism, designated by the numeral 140. As shown in FIG. 1, the testing mechanism 140 is connected via tubing 142 to a source of pneumatic pressure for vertically actuating the testing mechanism between its downward testing position, and its upward retracted position. Extending from the lower portion of the testing mechanism 140 are two pairs of electrical contacts 144 which, as shown in FIG. 7, include U-shaped end portions. The pairs of contacts 144 straddle the opposite leads of each component, with each pair aligned to engage, as shown in FIG. 2, one of the leads 26 and 28 of the reel of components. In operation, when the lead 28 of a component interrupts the light signal from the light source 130 to the light sensor 132, a signal will be generated by the optical sensor 132 and will be applied to the control circuitry of the subject apparatus so as to simultaneously stop the stepper motor of the conveying means, and actuate the pneumatic piston of the testing mechanism 140 to cause the latter to be actuated downwardly so that the pairs of contacts 144 engage the leads 26 and 28. When the testing mechanism is in its fully operative downward position, a signal will be developed within the mechanism for testing the component 24, and that signal will be stored in a suitable memory system forming a portion of the circuitry of the subject apparatus. Following completion of the test, the actuator of the testing mechanism 140 retracts the mechanism to its upward position, the stepper motor is initiated, and the cycle is repeated. If the test indicates that a component is defective, as that component reaches a subsequent station it is aligned with a reject cutting mechanism designated by numeral 150 in FIG. 1. The memory forming a portion of the circuitry of the apparatus actuates the cutting mechanism 150 so as to physically remove the defective electrical component from the reel of components, and the defective component is collected in the reject collection bin, designated by numeral 160 in FIG. 1. The reel of components continues along the conveying means and is subsequentally reeled about the take-up reel 18, along with the paper strip 34.

Accordingly there is provided a new and improved reel-to-reel handler capable of increased speed and efficiency in automatic test systems. The subject apparatus includes means for automatically stopping the conveying of the reel of components when an electrical component is in position for testing, as well as means for subjecting the electrical components to the desired environmental temperature conditions, while maintaining the temperature of the tape carrier at ambient conditions, thereby obviating misalignment or loosening of the components from the tape carrier. The subject invention also provides a sprocket-drive roller system that moves the transport tape at high speed, and which is capable of conveying tapes carrying different types of axial-lead devices. In the method of the subject invention for testing electrical components which are disposed in linear array on an elongated tape carrier, the electrical components are first conveyed in linear array to an environmental chamber, after which the electrical components are selectively subjected to a temperature different from the temperature of the tape carrier. The electrical components are then sequentially electrically tested, followed by the physical removal of or marking of the different devices from the reel of components. While the invention has been described in connection with a preferred embodiment of the apparatus, and the process for testing electrical components, it will be understood that it is not intended to limit the invention to those embodiments. On the contrary, it is intended to cover all alternatives, modifications and equivalents, as may be included within the spirit and scope of the invention, as defined by the appended claims.

What is claimed is:

1. Apparatus for elecrically testing taped electrical components secured to a pair of spaced tapes to form a string of components comprising:
   a take-up reel;
   a supply reel;
   drive means for conveying said taped electrical components from said supply reel to the take-up reel;
   an environmental chamber means disposed intermediate said supply and take-up reels for selectively varying the temperature of said electrical components relative to the temperature of the pair of spaced tape carriers; and
   electrical testing means disposed downstream of said environmental chamber means for sequentially testing the electrical components prior to the rewinding on the take-up reel.

2. Apparatus for electrically testing taped electrical components as in claim 1 wherein said drive means includes a synchronous motor for driving the take-up reel, a stepper motor, and a first grooved sprocket drive roller disposed downstream of the electrical tester and driven by said stepper motor.

3. Apparatus for eectrically testing taped electrical components as in claim 1 further including a second grooved sprocket drive roller disposed upstream of said environmental chamber means, with the second grooved sprocket drive roller being connected to an eddy-current brake so as to maintain tension on the taped electrical components while being conveyed through the environmental chamber means and the electrical testing means.

4. Apparatus for electrically testing taped electrial components as in claim 3 further including smooth rollers disposed adjacent said first and second grooved sprocket drive rollers for maintaining the alignment of said taped electrical components.

5. Apparatus for electrically testing taped electrical components as in claim 3 wherein each said sprocket drive roller is made of plastic material, and includes end portions of semi-soft annular rubber gaskets which are spaced to engage the tape portions of the taped electrical components.

6. Apparatus for electrically testing taped electrical components as in claim 5 further including spring means operative in cooperation with said second grooved sprocket drive roller to maintain the taped portions of the taped electrical components in engagement with the semi-soft annular rubber gaskets.

7. Apparatus for electrically testing taped electrical components as in claim 1 wherein said environmental chamber means includes a vertically movable upper hood, and a fixed lower support track, said upper and lower members having cooperating central U-shaped channels to define an elongated central passageway through which the electrical components are threaded.

8. Apparatus for elecrically testing taped electrical components as in claim 7 wherein said vertically movable hood further includes two longitudinally extending plenum chambers having apertures leading therefrom in order to provide cooling air to the taped portions of the taped electrical components.

9. Apparatus for electrically testing taped electrical components as in claim 7 further including a source of heat connected to said central chamber.

10. Apparatus for electrically testing taped electrical components as in claim 7 further including a source of cold air flow in communication with said central opening.

11. Apparatus for electrically testing taped electrical components carried on a supply reel and disposed in linear array as in claim 1 further including a thermocouple sensing means operatively associated with said environmental chamber means.

12. Apparatus for electrically testing taped electrical components as in claim 8 wherein said vertically movable hood comprises a central plastic portion and stainless steel side plates.

13. Apparatus for elecrically testing taped electrical components as in claim 1 wherein said electrical testing means includes an optical sensing means for sensing an electrical component at the electrical testing station, said electrical optical means being electrically connected to the drive means.

14. Apparatus for electrically testing taped electrical components as in claim 13 wherein said electrical testing means is vertically movable, and is actuated by pneumatic means controlled by said optical sensing means.

15. Apparatus for electrically testing taped electrical components as in claim 1 further including a reject cutting mechanism disposed downstream of said electrical testing means, and operative to sever defective electrical components from the reel of taped electrical components.

16. Method for testing electrical components transversely secured to a pair of spaced tape carriers to form a string of components wound about a supply reel comprising the steps of:
conveying said electrical components and spaced tape carriers in linear array from said supply reel to an environmental chamber means;
selectively subjecting said electrical components to a temperature different than the temperature of said tape carriers;
sequentially electrically testing the electrical components; and
conveying and winding said electrical components and tape carriers about a take-up reel.

17. Method for testing electrical components wound about a supply reel as in claim 16 further including the step of removing an electrical component which is found to be defective subsequent to the step of electrically testing said components.

18. Method for testing electrical components wound about a supply reel as in claim 16 wherein said electrical components are heated to a temperature greater than the temperature of said tape carriers.

19. Method for testing electrical components wound about a supply reel as in claim 16 wherein said electrical components are cooled within said environmental chamber means to a lower temperature than ambient temperature.

20. Method for testing electrical components disposed in linear array on an elongated tape carrier wound about a supply reel comprising the steps of:
conveying said electrical components and tape carrier in linear array from said supply reel to an environmental chamber;
selectively heating said electrical components within said environmental chamber to an elevated temperature, while simultaneously cooling said tape carrier;
sequentially electrically testing the electrical components of said linear array;
removing from said linear array any electrical component found to be defective during the step of electrically testing same; and
conveying and winding said electrical components and tape carrier about a take-up reel.

* * * * *